United States Patent
Lee et al.

(10) Patent No.: US 9,142,222 B2
(45) Date of Patent: Sep. 22, 2015

(54) APPARATUS AND METHOD OF ENHANCING QUALITY OF SPEECH CODEC

(75) Inventors: Mi-Suk Lee, Daejeon (KR); Do-Young Kim, Daejeon (KR); Byung-Sun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/613,792

(22) Filed: Sep. 13, 2012

(65) Prior Publication Data

US 2013/0066627 A1 Mar. 14, 2013

Related U.S. Application Data

(62) Division of application No. 12/529,239, filed as application No. PCT/KR2008/007024 on Nov. 28, 2008.

(30) Foreign Application Priority Data

Dec. 6, 2007 (KR) .................. 10-2007-0126371
Jan. 28, 2008 (KR) .................. 10-2008-0008590

(51) Int. Cl.
*G10L 21/00* (2013.01)
*G10L 21/0208* (2013.01)
(Continued)

(52) U.S. Cl.
CPC .............. *G10L 21/0208* (2013.01); *G10L 19/24* (2013.01); *G10L 21/0316* (2013.01); *G11B 20/10527* (2013.01); *H03G 3/341* (2013.01);
(Continued)

(58) Field of Classification Search
CPC ............ G10L 11/06; G10L 19/12; G06F 1/26
USPC .............. 704/200.1, 206, 210, 219, 223, 227, 704/230, 233, 262; 381/23, 119; 713/300
See application file for complete search history.

(56) References Cited

U.S. PATENT DOCUMENTS 5,473,366 A * 12/1995 Imaeda et al. ............. 348/14.01
5,687,285 A 11/1997 Katayanagi et al.
(Continued)

FOREIGN PATENT DOCUMENTS

CN 1551516 A 12/2004
EP 0 655 731 A2 5/1995
(Continued)

OTHER PUBLICATIONS

Roch Lefebvre, et al; "Shaping Coding Noise With Frequency-Domain Companding", 1997 IEEE Workshops on Speech Coding for Telecommunications Proceeding, Sep. 7-10, 1997, pp. 61-62.
(Continued)

*Primary Examiner* — Michael Colucci
(74) *Attorney, Agent, or Firm* — Ladas & Parry LLP

(57) ABSTRACT

An apparatus and method of improving the quality of a speech codec are provided. In the method, a first energy of a signal decoded by a low-band codec is calculated, and a second energy of a signal decoded by a low-band enhancement mode is calculated. Then, when the first energy is less than a first threshold value or less than a product of the second energy and a second threshold value, a size of the decoded signal is scaled. Accordingly, generation of a quantization error with respect to a silence segment is reduced.

8 Claims, 7 Drawing Sheets

(51) Int. Cl.
*G10L 19/24* (2013.01)
*G10L 21/0316* (2013.01)
*G11B 20/10* (2006.01)
*H03G 3/34* (2006.01)
*G10L 21/038* (2013.01)

(52) U.S. Cl.
CPC ..... *G10L 21/038* (2013.01); *G11B 2020/10555* (2013.01)

(56) References Cited

U.S. PATENT DOCUMENTS

| | | | |
|---|---|---|---|
| 6,510,409 B1* | 1/2003 | Su | 704/233 |
| 6,526,378 B1 | 2/2003 | Tasaki | |
| 6,691,085 B1 | 2/2004 | Rotola-Pukkila et al. | |
| 6,725,190 B1* | 4/2004 | Chazan et al. | 704/205 |
| 6,757,654 B1* | 6/2004 | Westerlund et al. | 704/262 |
| 6,871,106 B1 | 3/2005 | Ishikawa et al. | |
| 7,047,184 B1* | 5/2006 | Tasaki et al. | 704/200.1 |
| 7,539,612 B2* | 5/2009 | Thumpudi et al. | 704/200.1 |
| 8,086,446 B2* | 12/2011 | Oh et al. | 704/203 |
| 8,255,207 B2* | 8/2012 | Vaillancourt et al. | 704/219 |
| 8,386,266 B2* | 2/2013 | Feng et al. | 704/500 |
| 2002/0103637 A1 | 8/2002 | Henn et al. | 704/206 |
| 2003/0220783 A1* | 11/2003 | Streich et al. | 704/200.1 |
| 2004/0002856 A1 | 1/2004 | Bhaskar et al. | |
| 2004/0138874 A1* | 7/2004 | Kaajas et al. | 704/205 |
| 2005/0004793 A1 | 1/2005 | Ojala et al. | |
| 2005/0075873 A1* | 4/2005 | Makinen | 704/230 |
| 2006/0013405 A1* | 1/2006 | Oh et al. | 381/23 |
| 2006/0074643 A1 | 4/2006 | Lee et al. | |
| 2006/0106600 A1* | 5/2006 | Bessette | 704/223 |
| 2006/0224381 A1* | 10/2006 | Makinen | 704/223 |
| 2007/0043875 A1* | 2/2007 | Brannon, Jr. | 709/231 |
| 2007/0097936 A1* | 5/2007 | Lee et al. | 370/338 |
| 2007/0136056 A1* | 6/2007 | Moogi et al. | 704/227 |
| 2007/0208557 A1* | 9/2007 | Li et al. | 704/200.1 |
| 2007/0219791 A1 | 9/2007 | Gao et al. | |
| 2008/0002842 A1* | 1/2008 | Neusinger et al. | 381/119 |
| 2008/0027716 A1* | 1/2008 | Rajendran et al. | 704/210 |
| 2008/0155281 A1* | 6/2008 | Savransky et al. | 713/300 |
| 2008/0192738 A1* | 8/2008 | Florencio et al. | 370/389 |

FOREIGN PATENT DOCUMENTS

| | | |
|---|---|---|
| EP | 1 475 782 A2 | 11/2004 |
| JP | 07-152395 A | 6/1995 |
| JP | 07-193548 A | 7/1995 |
| JP | 07-307632 A | 11/1995 |
| JP | 08-046517 A | 2/1996 |
| JP | 11-330977 A | 11/1999 |
| JP | 3-437264 B2 | 8/2003 |
| JP | 2004-272292 A | 9/2004 |
| JP | 2004-302258 A | 10/2005 |
| KR | 10-0544731 B1 | 1/2006 |
| WO | 00/07178 A1 | 2/2000 |
| WO | 01/30049 A1 | 4/2001 |

OTHER PUBLICATIONS

International Search Report: mailed Apr. 30, 2009; PCT/KR2008/007024.

USPTO NFOA mailed Oct. 29, 2012 in connection with U.S. Appl. No. 12/529,239.

Yusuke Hiwasaki, et al; "A G.711 Embedded Wideband Speech Coding for VoIP Conferences", The Institute of Electronics, Information and Communication Engineers, vol. E89-D, No. 9, Sep. 2006, pp. 2542-2552.

Jongmo Sung, et al; "A draft recommendation of G.711WBE", International Telecommunication Union, ITU-T WP3/16, Document AC-0801-Q10-10, Jan. 2008, 68 pages.

* cited by examiner

APPARATUS AND METHOD OF ENHANCING QUALITY OF SPEECH CODEC

TECHNICAL FIELD

The present invention relates to a speech codec, and more particularly, to an apparatus and method for reducing quality degradation caused by an error in quantization of a silence segment upon speech coding.

BACKGROUND ART

A module for compressing a speech signal is called an encoder, and a module for decompressing a compressed speech signal is called a decoder. The most basic speech codec is an ITU-T G.711 codec which samples an input signal at 8 kHz and quantizes the sampled input signal to 8 bits. Where, in order to increase quantization efficiency, an A-law log quantizer as shown in Equation 1 or a u-law log quantizer as shown in Equation 2 is used.

$$AL(x) = \frac{Ax}{1 + \log_{10}(A)} \text{ for } 0 \leq x \leq \frac{1}{A} \quad (1)$$

$$AL(x) = \frac{1 + \log_{10}(Ax)}{1 + \log_{10}(A)} \text{ for } \frac{1}{A} \leq x \leq 1$$

$$uL(x) = \text{sign}(x) \frac{V_0 \log_{10}\left[1 + \frac{u|x|}{V_0}\right]}{\log_{10}[1 + u]} \quad (2)$$

A conventional log quantizer as described above applies different quantizing intervals according to the magnitudes of input signals. For example, a relatively wide quantizing interval is set for a signal having a small magnitude, and a relatively narrow quantizing interval is set for a signal having a large magnitude, that is, a signal highly likely to be generated. Accordingly, the efficiency of quantization is increased.

It is well known that quantization noise is evenly distributed over the entire bandwidth. However, according to the characteristics of human hearing, a quantization error existing in a segment of a signal having a large magnitude is not clearly heard as it is buried in the signal, and a quantization error existing in a segment of a signal having a small magnitude is easily heard as a noise. Accordingly, not only a speech segment but also a silence segment needs to be effectively coded because the coding of the silence segment affects the overall performance of a codec. In other words, noise caused by a quantization error in a silence segment may affect the overall sound quality.

A codec may have different performances according to the magnitudes of an input signal. In order to evaluate the performance of a speech codec, signals having different magnitudes, for example, signals of −16, −26, and −36 dBoV, are usually evaluated. In other words, a codec evaluates how its performance varies according to a change in the amplitude of an input signal.

In a codec such as G.711 or G.722, noise is generated due to a quantization error with respect to an input signal of −36 dBoV. In particular, a quantization error generated in a silence segment of the input signal serves as a factor in reducing the overall quality of the codec. Results of a subjective hearing test show that a mean opinion score (MOS) with respect to the input signal of −26 dBoV is higher than −36 dBoV.

DISCLOSURE OF INVENTION

Technical Problem

The present invention provides an apparatus and method of enhancing the quality of a speech codec, by which sound quality can be enhanced by reducing noise caused by a quantization error in a silence segment during speech coding so that the noise is not heard by a listener.

Technical Solution

According to an aspect of the present invention, there is provided a speech codec quality improving apparatus comprising: a first energy calculation unit calculating a first energy of a signal decoded by a low-band codec; and a scaling unit scaling a size of the decoded signal when the first energy is less than a first threshold value.

According to another aspect of the present invention, there is provided a speech codec quality improving method comprising: calculating a first energy of a signal decoded by a low-band codec; and scaling a size of the decoded signal when the first energy is less than a first threshold value.

Advantageous Effects

According to the present invention, the quality of a speech codec can be improved by reducing noises generated due to a quantization error with respect to a mute section. In particular, sound quality can be enhanced by reducing a quantization error generated in a mute section, that is, in an input signal of a codec, which has a small size.

BRIEF DESCRIPTION OF THE DRAWINGS

The above and other features and advantages of the present invention will become more apparent by describing in detail exemplary embodiments thereof with reference to the attached drawings in which.

BEST MODE

According to an aspect of the present invention, there is provided a speech codec quality improving apparatus comprising: a first energy calculation unit calculating a first energy of a signal decoded by a low-band codec; and a scaling unit scaling a size of the decoded signal when the first energy is less than a first threshold value.

According to another aspect of the present invention, there is provided a speech codec quality improving method comprising: calculating a first energy of a signal decoded by a low-band codec; and scaling a size of the decoded signal when the first energy is less than a first threshold value.

MODE FOR INVENTION

An apparatus and method of improving the quality of a speech codec according to the present invention will now be described more fully with reference to the accompanying drawings, in which exemplary embodiments of the invention are shown.

Figure 1:
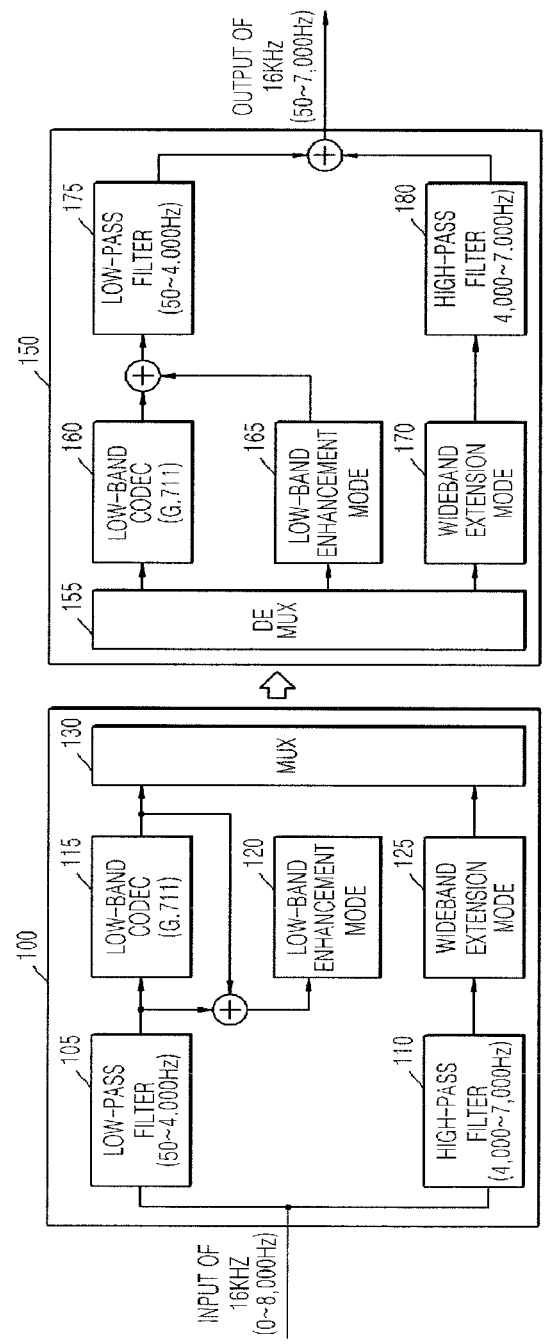
FIG. 1 illustrates a wideband extension codec using a narrowband codec according to an embodiment of the present invention.

FIG. 1 illustrates a wideband extension codec using a narrowband codec according to an embodiment of the present invention.

Referring to FIG. 1, the wideband extension codec is divided into a transmission side 100 and a reception side 150. The transmission side 100 includes a low-pass filter 105, a high-pass filter 110, a low-band codec 115, a low-band enhancement mode 120, a wideband extension mode 125, and a MUX 130. The reception side 150 includes a DEMUX 155, a low-band codec 160, a low-band enhancement mode 165, a wideband extension mode 170, a low-pass filter 175, and a high-pass filter 180.

A wideband input signal input to the transmission side 100 is divided into a low-band signal and a high-band signal while passing through the low-pass filter 105 and the high-pass filter 110, respectively. The low-band signal is coded by the low-band codec 115 and the low-band enhancement mode 120. The high-band signal is coded by the wideband extension mode 125. The low-band signal coded by the low-band codec 115 and the low-band enhancement mode 120 and the high-pass signal coded by the wideband extension mode 125, are output as a bitstream via the MUX 130.

The low-band enhancement mode 120 codes a part of the low-band signal that has not been expressed by the low-band codec 115, thereby improving the quality of a narrowband signal. In general, the low-band enhancement mode 120 determines an algorithm that operates according to the low-band codec 115. However, the low-band enhancement mode 120 mainly uses an algorithm that operates in the time domain, and the wideband extension mode 125 uses an algorithm that operates in the frequency domain.

The DEMUX 155 of the reception side 150 receives the bitstream from the transmission side 100 and outputs the bitstream to the low-band codec 160, the low-band enhancement mode 165, and the wideband extension mode 170. A determination as to whether the low-band enhancement mode 165 and the wideband extension mode 170 operate is made according to the received bitstream.

The reception side 150 may output a wideband signal according to an operation or non-operation of the wideband extension mode 170. Regardless of the bandwidth of an output signal of the reception side 150, the low-band codec 160 operates always. If only the low-band codec 160 operates, the reception side 150 may reproduce a basic narrowband signal. In order to reproduce a narrowband signal of better quality, the low-band enhancement mode 165 as well as the low-band codec 160 needs to operate. In addition, in order to output the wideband signal, both the low-band codec 160 and the wideband extension mode 170 need to operate. In other words, in order for the reception side 150 to reproduce a wideband output signal, output signals of the low-band codec 160 and the wideband extension mode 170 are added together. Of course, in order to reproduce a wideband signal of better quality, the reception side 150 adds the output signals of the low-band codec 160 and the low-band enhancement mode 165 to the output signal of the wideband extension mode 170.

In the International Telecommunication Union Telecommunication Standardization Sector (ITU-T), a standardization of a wideband extension codec that uses a G.711 codec as a low-band codec and has a structure similar to that of the wideband extension codec of FIG. 1 is in progress. In other words, a wideband extension codec based on a G.711 codec recommended by the ITU-T uses the G.711 codec as the low-band codecs 115 and 160, and can have such a structure as illustrated in FIG. 1. However, in the case of a signal of −36 dBoV, the G.711 codec generates noise due to a quantization error.

Figure 2A:
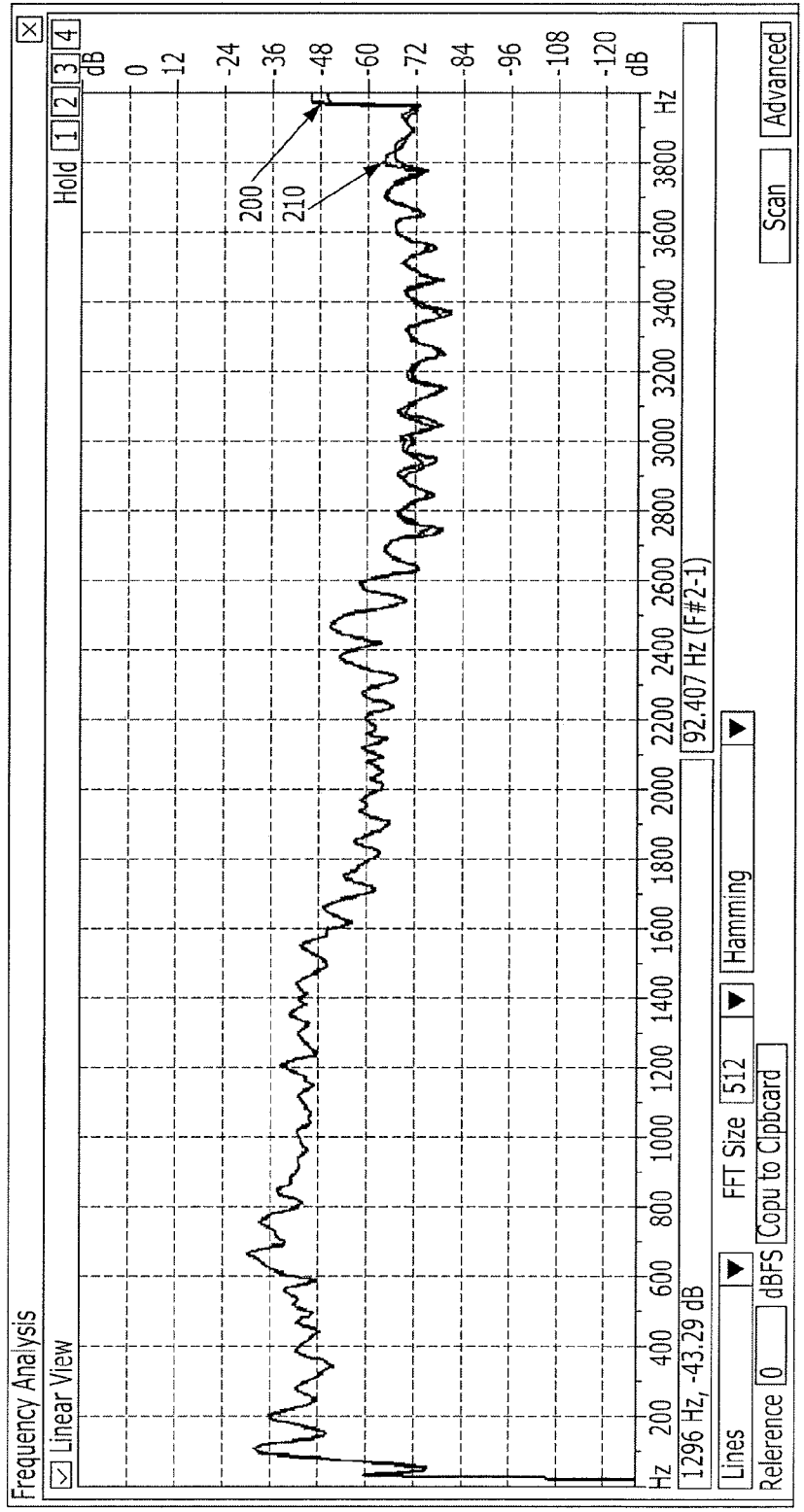
FIGS. 2A and 2B illustrate spectrums of an input signal and an output signal of an encoder and a decoder, respectively that use a G.711 codec.
Figure 2B:
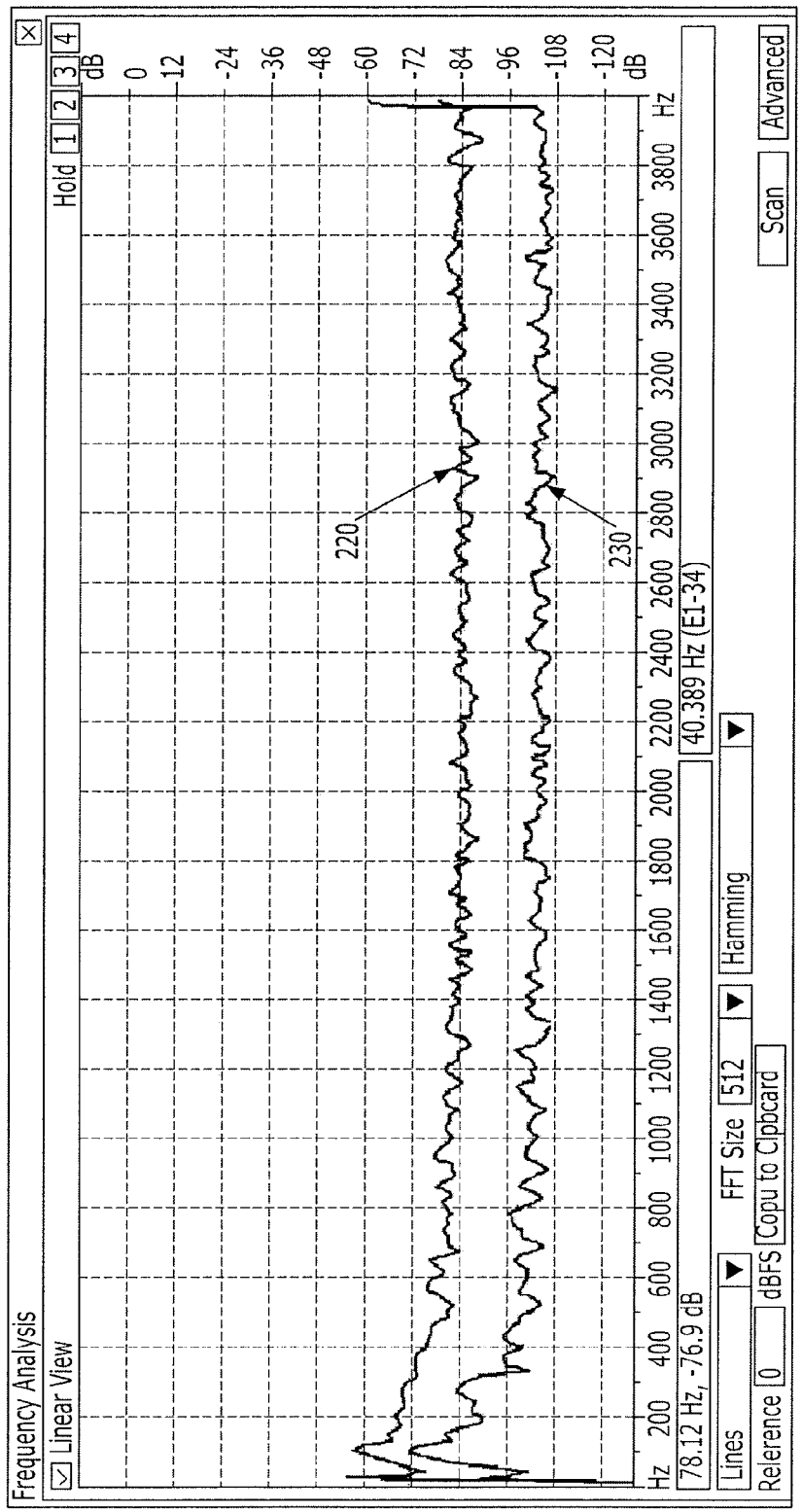

FIGS. 2A and 2B illustrate spectrums of an input signal and an output signal of an encoder and a decoder, respectively that use a G.711 codec. FIG. 2A illustrates a spectrum of a speech signal, and FIG. 2B illustrates a spectrum of a silence signal.

Referring to FIG. 2A, in terms of a speech signal, the spectrum of an input signal 200 of the encoder is almost the same as that of an output signal 210 of the decoder. However, referring to FIG. 2B, in terms of a silence signal, the spectrum of an input signal 230 of the encoder is different from that of an output signal 220 of the decoder. In other words, a speech segment has a small quantization error, whereas a silence segment has a large quantization error. This large quantization error is heard as noise by a listener.

Figure 3:
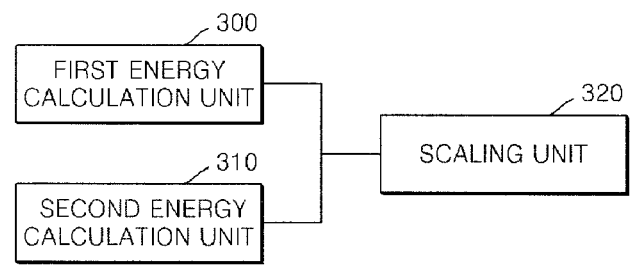
FIG. 3 illustrates a structure of a speech codec quality improving apparatus according to an embodiment of the present invention.

FIG. 3 illustrates a structure of a speech codec quality improving apparatus according to an embodiment of the present invention. Referring to FIG. 3, the speech codec quality improving apparatus includes a first energy calculation unit 300, a second energy calculation unit 310, and a scaling unit 320.

The first energy calculation unit 300 calculates an energy of a signal decoded by a low-band codec (hereinafter, referred to as an energy of a low-band codec). The first energy calculation unit 300 calculates the energy of the low-band codec in units of frames. In the case where the G.711 codec is used as the low-band codec, the size of a frame may vary according to an environment where the G.711 codec is used. In other words, the first energy calculation unit 300 calculates energy of one frame by summing the energies of samples.

When a low-band enhancement mode is in operation, the second energy calculation unit 310 calculates an energy of a signal decoded by a low-band enhancement mode codec (hereinafter, referred to as an energy of an enhancement mode).

When the energy of the low-band codec is less than a predetermined threshold value Thr1, the scaling unit 320 scales the size of the signal decoded by the low-band codec. When the energy of the low-band codec is less than a product of the energy of the enhancement mode and a predetermined threshold Thr2, the scaling unit 320 scales the size of the signal decoded by the low-band codec. The scaling unit 320 may scale the size of the decoded signal by a constant "a" that is less than 1. Alternatively, the scaling unit 320 may perform scaling by multiplying the decoded signal by a gain that is less than 1 and is proportional to a sum of an energy of a current frame (i.e., an energy of the low-band codec or enhancement mode) and a previous frame (i.e., an energy of the low-band codec or enhancement mode), thereby preventing a sudden change caused by scaling. In this case, the scaling unit 320 may calculate a size of a current scaling in consideration of a size of a previous scaling. In other words, the scaling unit 320 may calculate the size of the current scaling by adding a certain rate of a gain obtained based on the energies of the current and previous frames to a certain rate of the size of the previous scaling. Of course, scaling may be performed in units of samples.

When the majority of the energy of the decoded signal exists in a high band, the scaling unit 320 may not perform scaling. For example, when the energy of the signal decoded by a wideband extension mode is greater than the energy of the low-band codec or enhancement mode by at least a predetermined value, the scaling unit 320 does not perform scaling.

The threshold values Thr1 and Thr2, the scaling size "a," etc. which is used for scaling, may be calculated by experimentation. Of course, these values may vary according to embodiments of the present invention.

Figure 4:
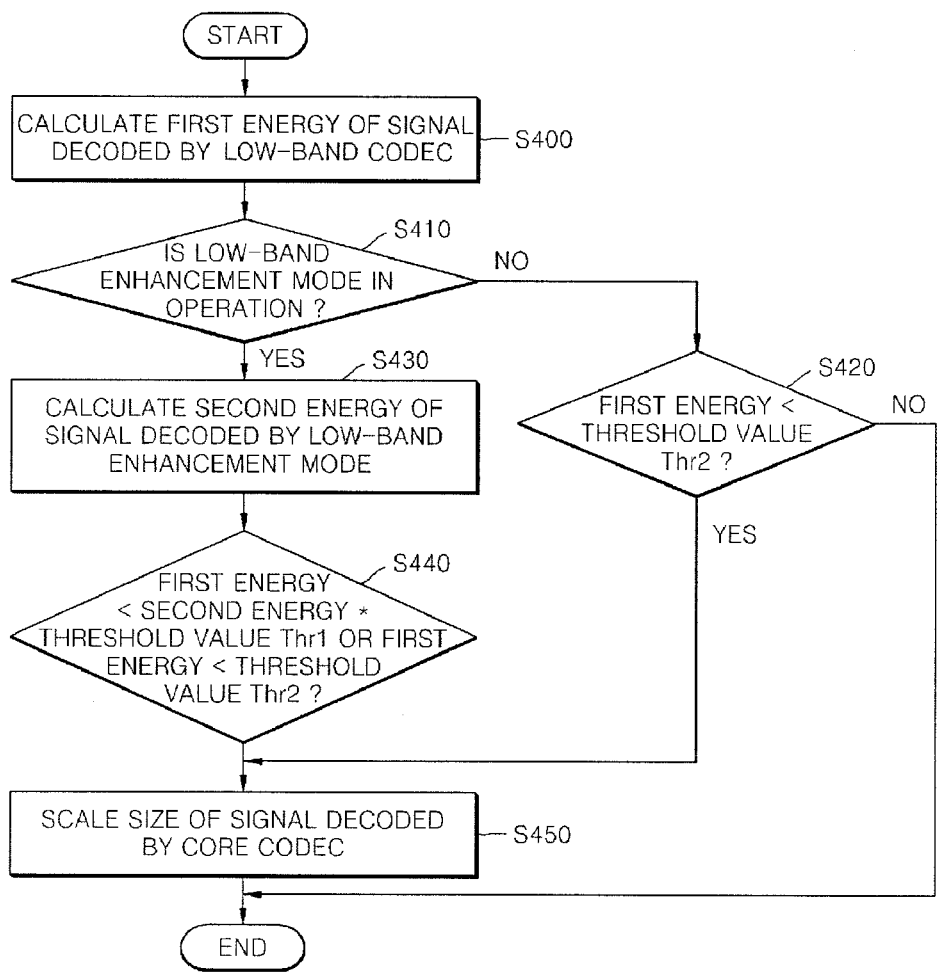
FIG. 4 is a flowchart illustrating a speech codec quality improving method according to an embodiment of the present invention.

FIG. 4 is a flowchart illustrating a speech codec quality improving method according to an embodiment of the present invention. Referring to FIG. 4, in operation S400, a speech codec quality improving apparatus (hereinafter, referred to as an apparatus) according to the present invention calculates an energy of a signal decoded by a low-band codec (hereinafter, referred to as an energy of the low-band codec). The size of a frame may depend on the type of codec and an environment in which a codec is applied. As illustrated in FIG. 1, when the present invention is applied to a wideband extension codec using a narrowband speech codec, a low-band enhancement mode may exist. Accordingly, in operation S410, the apparatus determines whether the low-band enhancement mode is in operation.

If it is determined in operation S410 that the low-band enhancement mode is in operation, the apparatus calculates the energy of the signal decoded by the low-band enhancement mode (hereinafter, referred to as an energy of an enhancement mode), in operation S430. When the energy of the low-band codec is less than a product of the energy of the enhancement mode and a predetermined threshold value Thr1 or less than a predetermined threshold value Thr2 in operation S440, the apparatus scales the size of the signal decoded by the low-band codec by the constant "a", which is less than 1, in operation S450.

On the other hand, if it is determined in operation S410 that the low-band enhancement mode is not in operation, it is determined whether the energy of the low-band codec is less than the predetermined threshold value Thr2, in operation S420. If it is determined in operation S420 that the energy of the low-band codec is less than the predetermined threshold value Thr2, the apparatus scales the decoded signal, in operation S450. Scaling is performed by multiplying the decoded signal by a gain that is less than 1 and is proportional to a sum of an energy of a current frame (i.e., an energy of the low-band codec or enhancement mode) and a previous frame (i.e., an energy of the low-band codec or enhancement mode), thereby preventing a sudden change caused by scaling. In this case, the size of current scaling may be calculated by adding a certain rate of a gain obtained based on the energies of the current and previous frames to the size of the previous scaling.

As described above, the threshold values Thr1 and Thr2, the scaling size, etc. are previously calculated by experimentation.

Figure 5A:
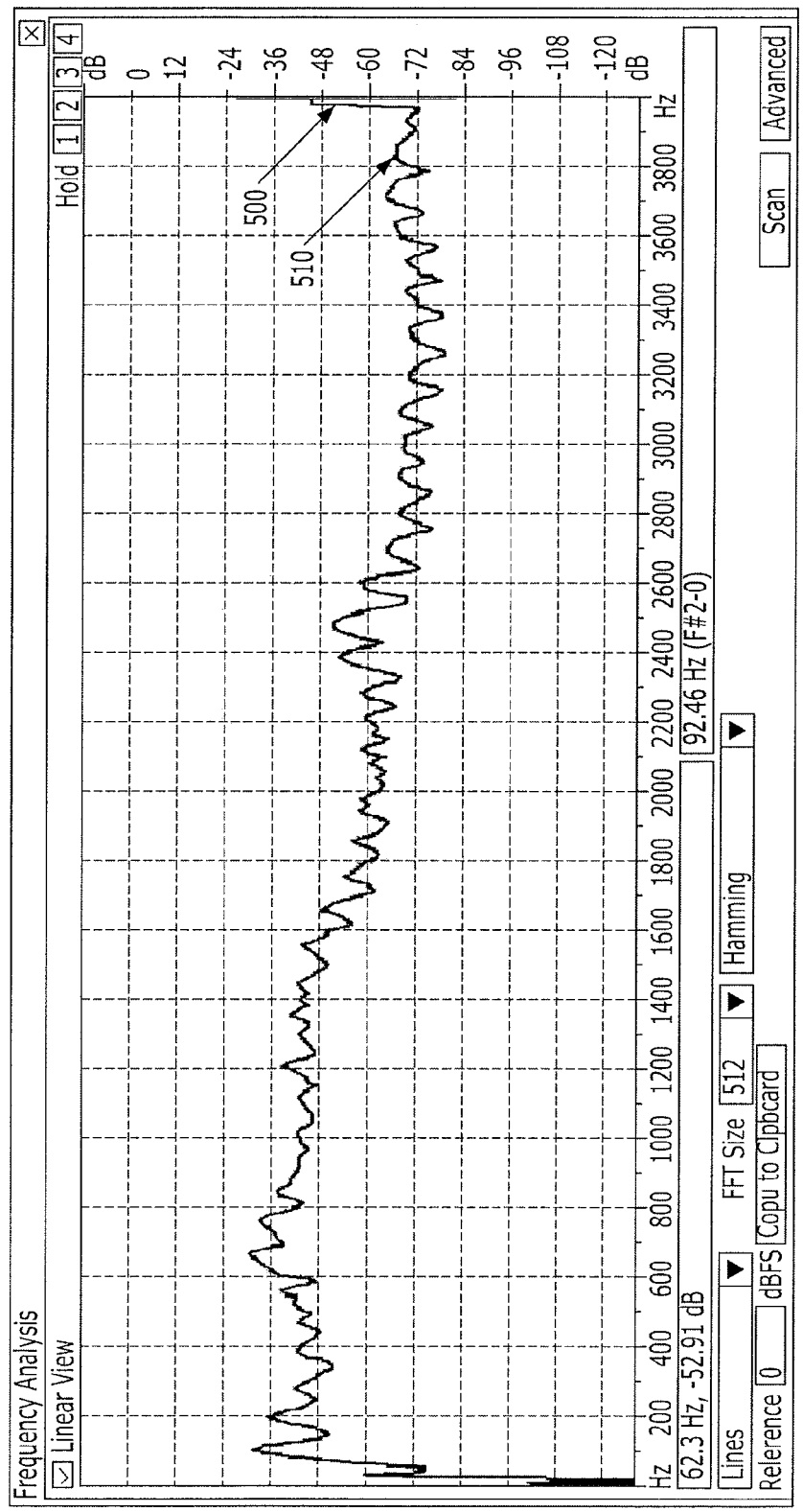
FIGS. 5A and 5B illustrate a spectrum of an output signal of a decoder using a G.711 codec when a speech codec quality improving method according to the present invention is applied and a spectrum of the output signal of the decoder using the G.711 codec when the speech codec quality improving method according to the present invention is not applied.
Figure 5B:
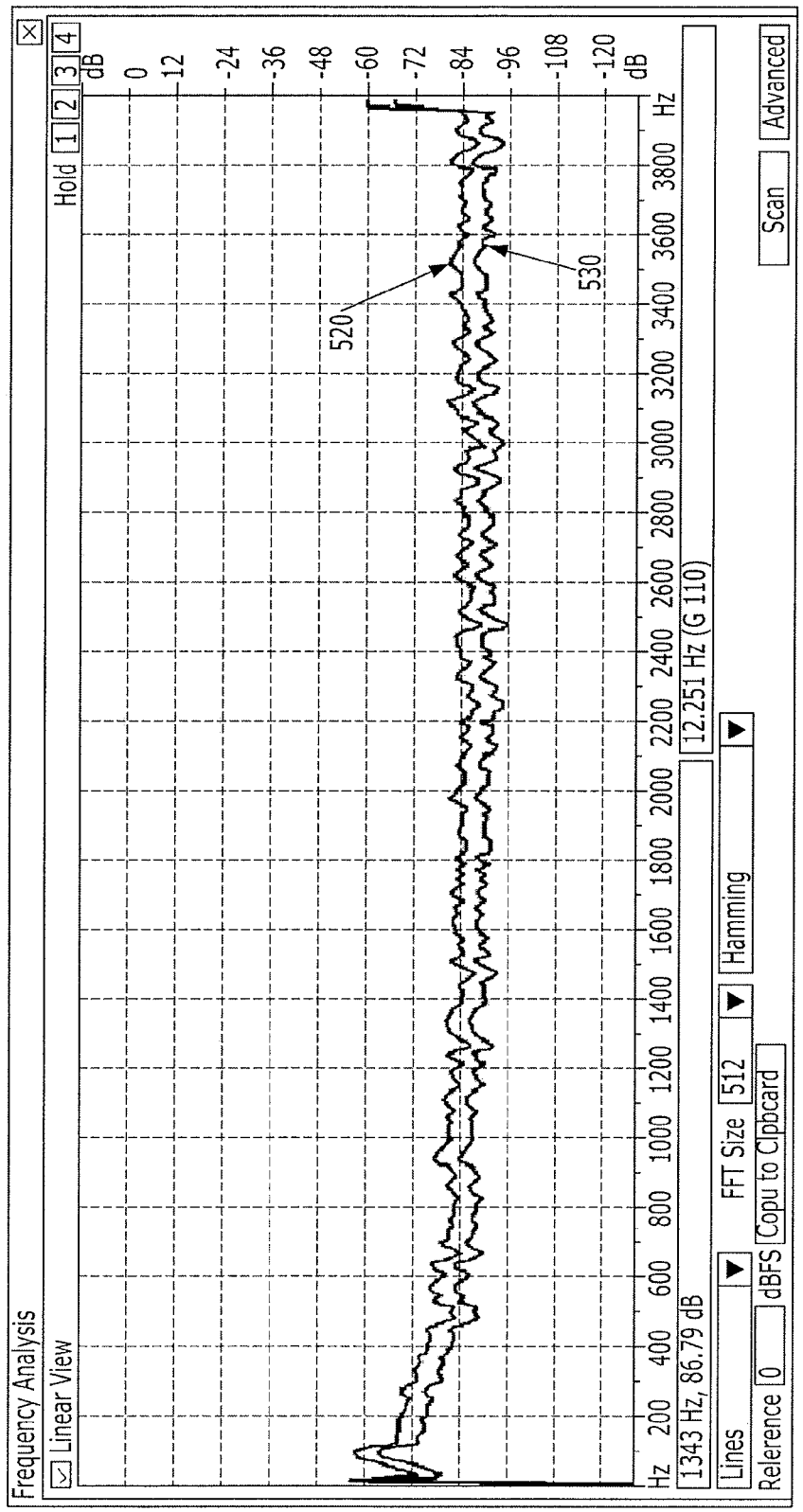

FIGS. 5A and 5B illustrate a spectrum of an output signal of a decoder using a G.711 codec when a speech codec quality improving method according to the present invention is applied and a spectrum of the output signal of the decoder using the G.711 codec when the speech codec quality improving method according to the present invention is not applied. FIG. 5A illustrates spectrums of a speech signal, and FIG. 5B illustrates spectrums of a mute signal.

Referring to FIG. 5A, in the case of a speech signal, a spectrum of an output signal 500 of a decoder before the speech codec quality improving method according to the present invention is applied is consistent with a spectrum of an output signal 510 of the decoder after the speech codec quality improving method according to the present invention is applied.

Referring to FIG. 5B, in the case of a mute signal, a size of an output signal 520 of the decoder before the speech codec quality improving method according to the present invention is applied is less than a size of an output signal 530 of the decoder after the speech codec quality improving method according to the present invention is applied. In other words, the level of the output signal of the decoder in a mute section is decreased, leading to a reduction in quantization error.

According to the present invention, the quality of a speech codec can be improved by reducing noises generated due to a quantization error with respect to a mute section. In particular, sound quality can be enhanced by reducing a quantization error generated in a mute section, that is, in an input signal of a codec, which has a small size.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A speech codec quality improving apparatus comprising:
   a computer system comprising a processor and a memory;
   an energy calculation unit operating on the computer system and adapted to calculate an energy of a low-band decoded signal; and
   a scaling unit operating on the computer system and adapted to:
     scale a size of the decoded signal by a gain, when the gain is less than a threshold value,
   wherein the low-band decoded signal include a signal decoded by a low-band codec and low-band enhancement mode when the low-band enhancement mode is enabled,
   wherein the low-band codec uses a G.711 codec,
   wherein the gain based on energies of a low-band decoded signal of current and previous frame,
   wherein the gain is further modified in sample by sample,
   wherein the scaling unit performs scaling in units of samples within a frame of a decoded signal, the scaling is performed in a silent segment,
   wherein the energy calculation unit is adapted to calculate the energy of the low-band decoded signal in units of frames,
   wherein scaling the size of the decoded signal reduces human audible noises, and wherein the scaling unit is adapted to not performing scaling, when the power of the signal decoded by a wideband extension mode is greater than the power of a signal decoded by a low-band codec and a low-band enhancement mode by at least a predetermined value.

2. The speech codec quality improving apparatus of claim 1, wherein the scaling unit is adapted to determine whether to perform scaling based on the power of the high-band and low-band decoded signal.

3. The apparatus of claim 1 wherein the human audible noises correspond to a quantization error.

4. The apparatus of claim 3 wherein the quantization error occurs with respect to silent segment of the signal.

5. A non-transitory computer readable storage medium having processor executable instructions to:
   calculate an energy of the low-band decoded signal; and
   scale a size of the decoded signal by a gain, when the gain is less than a threshold value,
   wherein the low-band decoded signal include a decoded signal by a low-band codec or a decoded signal by a low-band codec and low-band enhancement mode,
   wherein the low-band codec uses a G.711 codec,
   wherein the gain is based on energies of a low-band decoded signal of current and previous frame,
   wherein the scaling of the size of the decoded signal performs scaling in units of samples within a frame of a decoded signal, the scaling is performed in a silent segment,
   wherein the gain is calculated in sample by sample by further consideration of a previous gain,
   wherein the calculating of the energy of the low-band decoded signal calculated the energy of the decoded signal in units of frames,
   wherein scaling the size of the low-band decoded signal reduces human audible noises, and
   wherein the scaling of the size of the decoded signal does not performing scaling, when the power of a signal decoded by a wideband extension mode is greater than the power of a signal decoded by a low-band codec and a low-band enhancement mode by at least a predetermined value.

6. The non-transitory computer readable storage medium of claim 5 wherein the scaling of the size of a decoded signal determines whether to perform scaling based on the power of a high-band and low-band decoded signal.

7. The non-transitory computer readable storage medium of claim 5 wherein the human audible noises correspond to a quantization error.

8. The non-transitory computer readable storage medium of claim 7 wherein the quantization error occurs with respect to a silent segment of the signal.

* * * * *